Figure 1:
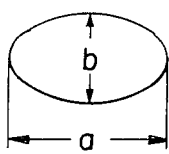
Figure 1:
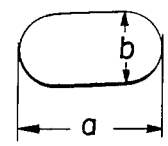
Figure 1:
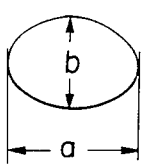
Figure 1:
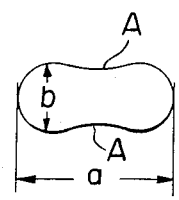
Figure 1:
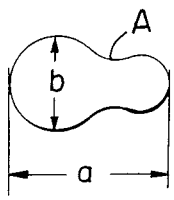
Figure 1:
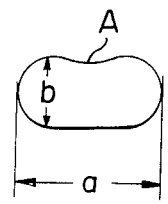
Figure 1:
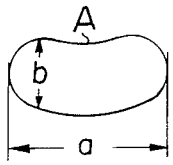

United States Patent [19]

Ohta et al.

[11] Patent Number: 4,981,753
[45] Date of Patent: Jan. 1, 1991

[54] FABRIC FOR PRINTED CIRCUIT SUBSTRATE AND PRINTED CIRCUIT SUBSTRATE

[75] Inventors: Hironori Ohta; Takashi Mukaiyama, both of Yokohama, Japan

[73] Assignee: Asahi Glass Company Ltd., Tokyo, Japan

[21] Appl. No.: 246,967

[22] Filed: Sep. 21, 1988

Related U.S. Application Data

[63] Continuation of Ser. No. 854,599, Apr. 22, 1986, abandoned.

[30] Foreign Application Priority Data

Apr. 23, 1985 [JP] Japan ................................. 60-85459
May 7, 1985 [JP] Japan ................................. 60-95442

[51] Int. Cl.⁵ .................... B32B 17/00; D04H 3/00
[52] U.S. Cl. ........................................ 428/224; 65/1;
65/2; 428/225; 428/268; 428/273; 428/290;
428/292; 428/293; 428/397; 428/401
[58] Field of Search ....................... 65/1, 2, 13, 12;
428/268, 273, 292, 293, 224, 225, 397, 401, 290;
501/12

[56] References Cited

U.S. PATENT DOCUMENTS

| | | | |
|---|---|---|---|
| 3,063,094 | 11/1962 | Warthen | 65/2 |
| 3,082,099 | 3/1963 | Beasley et al. | 65/2 |
| 3,579,409 | 5/1971 | Shannol | 428/397 X |
| 3,821,070 | 6/1974 | Mansmann et al. | 501/12 X |
| 3,924,663 | 12/1975 | Dean . | |
| 4,332,601 | 6/1982 | Wegerhoff et al. | 65/2 |
| 4,461,855 | 7/1984 | Phillips | 428/397 |
| 4,579,772 | 4/1986 | Bhatt et al. | 428/397 |
| 4,698,083 | 10/1987 | Shioura et al. | 264/177.13 |

FOREIGN PATENT DOCUMENTS

0146108 6/1985 European Pat. Off. .
0196194 10/1986 European Pat. Off. .

OTHER PUBLICATIONS

Klein, Lisa C., "Sol-Gel Glass Technology Update The Glass Industry", May 1982.
Sakka, Sumio, "Gel Method for Making Glass", Treatise on Materials Science and Technology, vol. 22, copyright 1982 by Academic Press, Inc.

*Primary Examiner*—Lorraine T. Kendell
*Attorney, Agent, or Firm*—Oblon, Spivak, McClelland, Maier & Neustadt

[57] ABSTRACT

A fabric for a printed circuit substrate composed essentially of inorganic fibers having a non-circular cross section.

4 Claims, 2 Drawing Sheets

FABRIC FOR PRINTED CIRCUIT SUBSTRATE AND PRINTED CIRCUIT SUBSTRATE

This application is a continuation of application Ser. No. 854,599, filed on Apr. 22, 1986, now abandoned.

The present invention relates to a fabric for a printed circuit substrate and to a printed circuit substrate.

In this specification, the term "fabric" includes woven and non-woven fabrics.

As conventional woven fabrics for printed circuit substrates made of inorganic fibers, glass woven fabrics made of non-alkali glass fibers such as those described in JIS (Japanese Industrial Standard) R3413 are common, and woven fabrics made of silica glass fibers have rarely been employed. These fibers are prepared by a melting method, and the cross-section of the fiber filaments is usually a substantially perfect circle or so close to a perfect circle that it can be regarded practically as circular. In a case where a woven fabric made of these fibers (such as the one described in JIS R3414) is used as a base material for a shaped product such as a printed circuit substrate, prepared by using e.g. an unsaturated polyester resin, an epoxy resin or a phenol resin as a matrix, it is employed in the form of a finished woven fabric (such as the one described in JIS R3416) prepared by firstly removing the size by a suitable method such as heat cleaning, followed by surface finishing with a chromium-type finishing agent or a silane-type finishing agent to strengthen the adhesion with the resin.

A printed circuit substrate is a FRP board. It is a laminated board prepared by laminating such finished fabrics by using the above-mentioned resin as a matrix. The number of laminated layers is usually from 4 to 8 layers, but some of multilayer laminated boards (hereinafter referred a "multilayer boards") contain 10 or more layers. Such laminated boards having a copper foil attached on one side or on each side, are called copper-clad laminates for printed circuits.

As a glass woven fabric useful for a printed circuit substrate, it is common to employ a plain weave non-alkali glass fabric having a thickness of from about 0.03 to about 0.18 mm and a weight of from about 25 to about 200 g/m². The features of the glass woven fabric as a base material for a printed circuit substrate, include various properties such as the electric characteristics, the mechanical properties, the chemical resistance and the non-hygroscopic property, particularly the non-flammability, the heat resistance and the dimensional stability. The quality requirements are rather severe as compared with the requirements for glass woven fabrics of general use. Particularly high standards are required for the uniformity of values such as yarn density, thickness and weight per unit area, and for the outer appearance.

In a case where the printed circuit substrate is a multilayer board, among various properties which the multilayer printed circuit substrate or thin copper-clad laminate for a multilayer printed circuit (in each case, hereinafter referred to simply as a "multilayer board") should have, a dimensional stability (as represented by a dimensional change) may be particularly mentioned as one of the properties mainly attributable to the glass woven fabric as the base material and the resin. According to JIS C6486-1980, the dimensional stability (the dimensional change) of a thin copper-clad laminate for a multilayer printed circuit (glass fabric base material and epoxy resin) is required to be at most 0.05% after the etching treatment and at most 0.05% after the heat treatment. Multilayer boards made of glass woven fabrics of usual non-alkali glass fibers, satisfy these required values. However, as the number of laminated layers increases, these required values tend to be severe barriers. The dimensional stability (the dimensional change) according to JIS C6486-1980, is represented by the dimensional change of a test piece cut out from the substrate of the original thickness when the copper foil is removed by etching, and the dimensional change from the dimension after the removal of the copper foil to the dimension after the treatment at 170° C. for 30 minutes followed by cooling to room temperature. The thermal properties of the resin such as the thermal expansion coefficient, the thermal expansion coefficient of the glass, the bond strength between the resin and the glass, etc. may be mentioned as factors attributable to the dimensional stability. For the improvement of the dimensional stability, it is conceivable that the thermal expansion coefficient of the resin should be small, the dimensional restoration of the resin to the original dimension after being subjected to heating should be good, the thermal expansion coefficient of the glass fibers (which is usually smaller than that of the resin) should be small, and the resin and the glass fibers should be firmly bonded.

Accordingly, it is an object of the present invention to provide a fabric for a printed circuit substrate which is made of inorganic fibers and which is capable of providing a printed circuit substrate having excellent dimensional stability when molded together with a resin into a printed circuit substrate.

Another object of the present invention is to provide a printed circuit substrate comprising a fabric made of inorganic fibers and a resin and having excellent dimensional stability.

The present invention provides a fabric for a printed circuit substrate composed essentially of inorganic fibers having a non-circular cross section.

Further, the present invention provides a printed circuit substrate comprising such a fabric and a resin.

Now, the present invention will be described in detail with reference to the preferred embodiments.

According to a first preferred embodiment, the non-circular cross section of the inorganic fibers is of an elliptic, oblong or oval shape with an aspect ratio (major axis/minor axis) of from 1.5 to 7.5, or of such an elliptic, oblong or oval shape with at least one recessed portion.

According to a second preferred embodiment, the non-circular cross section of the inorganic fibers is of a bend shape of <, or of such a bend shape with at least one recessed portion.

In the accompanying drawings,

FIGS. 1(1), (2), (3), (4), (5) and (6) show cross-sectional views illustrating various cross sections of monofilaments of silica glass fibers obtained by a sol-gel direct spinning method according to the first preferred embodiment of the present invention. (1) shows a cross-section of an elliptic shape, (2) shows a cross section of an oblong shape, and (3) shows a cross section of an oval shape. (4) shows a cross section of (1) or (2) with two recessed portions. Likewise, (5) shows a cross section of (3) with two recessed portions. (6) shows a cross section of (2) with one recessed portion. Likewise, (7) shows a cross section of (1) with one recessed portion. The symbol "a" represents the major axis which is the maximum diameter of the cross sectional shape, and the symbol "b" represents the minor axis which is the maximum diameter in the direction perpendicular t the major axis. "A" indicates a recessed portion of the non-circular cross section.

Figure 2A:
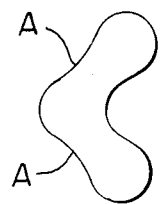

FIGS. 2(a) and (b) show cross-sectional views illustrating the cross sections of monofilaments of silica glass fibers obtained by a sol-gel direct spinning method according to the second preferred embodiment of the present invention. (a) represents a non-circular cross section of a bend shape of <, and (b) represents a similar non-circular cross section of a bend shape of < with a moderate curvature at the outer circumference of the < shape cross section. "A" indicates a recessed portion of the cross section.

Figure 3A:
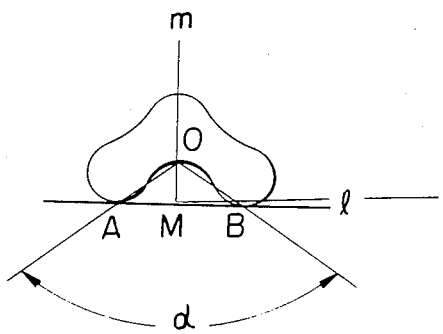
Figure 3B:
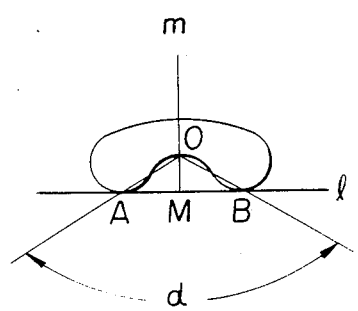

FIG. 3 is a view illustrating the angle α of the curvature.

In this invention, inorganic fibers include E glass fibers, silica glass fibers and other glass fibers having different compositions.

In this invention, non-woven fabrics include fabrics made of chopped strands, chopped filaments, continuous strands or continuous filaments, or of a combination thereof.

As inorganic fibers having the above-mentioned cross-sectional shapes, silica glass fibers obtained by a sol-gel direct spinning method may be mentioned.

The sol-gel direct spinning method is a spinning method wherein an metal alcoholate such as ethyl silicate or methyl silicate is hydrolyzed and polymerized by using an acid or alkali as a catalyst to obtain a sol solution composed mainly of a chain polymer having a structure of e.g.

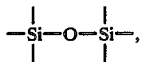

and when the viscosity reaches a proper level of from 10 to 1000 poise, the sol solution is extruded from nozzles for spinning to obtain gel fibers. In this state, a substantial amount of carbon such as the alkoxide still remains in the fibers, and the tensile strength of the fibers is low. Therefore, the fibers are subjected to heat treatment at a temperature of from 700° to 1300° C. for from a few seconds to a few hours to evaporate the remaining carbon and to bake the fibers to obtain silica glass fibers having high strength.

Heretofore, silica glass fibers have been prepared by a melting method wherein e.g. silica sand having a high purity is melted at a temperature of higher than 2000° C. to obtain cylindrical precursors for silica glass, which are again melted by means of e.g. gas burners to obtain fibers. In such a method, a considerable energy is required, and the fibers will be very expensive. Whereas, according to the sol-gel method, the heat treatment can be done at a level of from 800° to 1300° C., whereby it is possible to obtain silica glass fibers inexpensively.

As mentioned above, in the sol-gel direct spinning method, a sol solution obtained by the hydrolysis and polymerization of a metal alcoholate by using an acid or alkali as a catalyst, is subjected to spinning.

In this case, the main starting materials are the metal alcoholate, water, the catalyst and an alcohol used for diluting the water. With respect to the proportions of these starting materials, as the ratio of the water to the metal alcoholate increases, the cross-sectional shape generally tends to be close to a perfect circle (aspect ratio: 1). Inversely, as the ratio decreases, the cross-sectional shape tends to be elliptic, oblong or oval, and the aspect ratio tends to be greater than 1, and further the cross-sectional shape tends to be constricted at the central portion.

In the first preferred embodiment of the present invention, the monofilaments of silica glass fibers obtained by the sol-gel direct spinning method have various cross-sectional shapes as illustrated in FIGS. 1(1), (2), (3), (4), (5) and (6). Namely, (1) shows an elliptic cross-sectional shape, (2) shows an oblong cross-sectional shape, (3) shows an oval cross-sectional shape, (4) shows a cross-sectional shape of (1) or (2) having two recessed portions, (5) shows a cross-sectional shape of (3) having two recessed portions, (6) shows a cross-sectional shape of (2) having one recessed portion, and (7) shows a cross-sectional shape of (1) having one recessed portion.

As compared with the weaving efficiency of a woven fabric from conventional inorganic fibers, there is no particular problem in weaving a fabric from inorganic fibers having a non-circular cross section with an aspect ratio (major axis/minor axis) of from 1.5 to 7.5, and/or inorganic fibers having such a non-circular cross section with at least one recessed portion. Further, with respect to the fabric according to the first preferred embodiment of the present invention, the removal of the size by heat cleaning or the surface finishing with various finishing agents, can be conducted in the same manner as in the case of conventional fabrics. Furthermore, there is no substantial difference in the drill processability between the printed circuit substrate of the present invention and the conventional products made by silica glass fabric by a melting method.

In the first preferred embodiment of the present invention, the aspect ratio (major axis/minor axis) of the cross-sectional shape of a fiber monofilament is represented by a ratio of a/b where "a" is the major axis and "b" is the minor axis, as shown in FIGS. 1(1) to (7). The major axis "a" is the maximum diameter of the cross-sectional shape, and the minor axis "b" is the maximum diameter in the direction perpendicular to the maximum diameter taken as the major axis.

The monofilaments in the first preferred embodiment of the present invention may have a cross section of such a non-circular shape with at least one recessed portion (portion "A") as shown in FIGS. 1(4), (5), (6) and (7).

The aspect ratio of the cross-sectional shape of the inorganic fibers in the first preferred embodiment of the present invention is from 1.5 to 7.5, more preferably from 1.5 to 5.0. If the aspect ratio is less than 1.5, the effectiveness of the present invention is small. On the other hand, it is difficult to produce fibers having an aspect ratio of higher than 7.5 constantly.

In a case where the cross-sectional shape of fibers is an elliptic shape, the major axis is preferably within a range of from 10 to 30 μm, the minor axis within a range of from 5 to 20 μm, and the aspect ratio within a range of from 1.5 to 5.0.

The tensile strength of monofilaments of the inorganic fibers in the first preferred embodiment of the present invention, is preferably at least about 15 kg/mm² taking into consideration the operational efficiency of the spinning step, subsequent processing step and weaving step, and the product quality.

The woven fabric for a printed circuit substrate according to the first preferred embodiment of the present invention usually has a thickness of from 0.025 to 0.40 mm, preferably from 0.030 to 0.30 mm, and a weight within a range of from 15 to 450 g/m², preferably from 15 to 300 g/m².

If the thickness is thinner than the above range or if the weight is lighter than the above range, the reinforcing effectiveness of the fabric tends to be poor when made into a substrate, and it becomes difficult to achieve the intended object. However, for a multilayer board, a fabric is required to be as thin as identified by the above range. On the other hand, the fabric is not required to be so thick, since it is intended for use in a printed circuit substrate. By providing fabrics having various thickness, it is possible to broaden the range from which the fabric is chosen taking into consideration the reinforcing effect and the operational efficiency, for instance, by using, instead of a small number of thick fabrics, a large number of thin fabrics without changing the total weight of the fabrics in the substrate, or vice versa.

As an example of the non-woven fabric according to the first preferred embodiment of the present invention, a mat made of chopped strands and having a thickness of from 0.1 to 0.5 mm and a weight of from 15 to 150 g/m², may be mentioned.

The non-woven fabrics may be used alone or in combination with woven fabrics.

The fabric for a printed circuit substrate according to the first preferred embodiment of the present invention, is a fabric composed essentially of inorganic fibers having a non-circular cross section of an elliptic shape, an oblong shape or an oval shape with an aspect ratio of from 1.5 to 7.5, and/or inorganic fibers having such a non-circular cross section with at least one recessed portion. The inorganic fibers are used in a weight ratio of from 40 to 100%, preferably from 50 to 100%.

As mentioned above according to the sol-gel direct spinning method, a sol solution obtained by the hydrolysis and polymerization of a metal alcoholate by using an acid or an alkali as a catalyst, is subjected to spinning, and, in this case, monofilaments having a generally angular cross section of < shape can be obtained by using a starting material composed mainly of an metal alcoholate, cellulose acetate, water, a catalyst and acetone for diluting the water.

Figure 2B:

The cross sections of < shape of the monofilaments of silica glass fibers obtained by a sol-gel direct spinning method according to the second preferred embodiment of the present invention, are shown in FIGS. 2(a) and (b). FIG. 2(a) shows a bend shape cross section of <, whereas (b) shows such a bend shape cross section of < with a moderate curvature at the outer circumference of the < shape cross section. The bend shape cross section of < according to the second preferred embodiment of the present invention includes such a cross section as shown in FIG. 2(b). Likewise, the inorganic fibers having a bend shape cross section of < include inorganic fibers having a cross-sectional shape as shown in FIG. 2(b). Both cross sections (a) and (b) have symmetry axes in the sense of approximation. However, the bend shape cross section of < of the present invention includes deformed cross-sectional shapes having no symmetry axes. The cross sections (a) and (b) have smooth circumference, and the cross section (a) has two recessed portions at "A".

The degrees of the curvatures of bend shape cross sections of <, are represented by an angle $\alpha$ in FIGS. 3(a) and (b), and the angle $\alpha$ will be referred to as a "curvature angle". As shown in FIGS. 3(a) and (b), the angle $\alpha$ is an angle between OA and OB i.e. $\angle AOB$, when the bend shape cross sections of < of the monofilaments are arranged to stand upright on a horizontal plane with the inside of the curvature facing downwardly, the contacting points thereof with the horizontal plane are designated as A and B, the center point of the length of AB is designated as M, the vertical bisector of the distance AB is designated as m, and the intersecting point of m with the inside of the curvature of the generally angular cross sections of < shape is designated as O. In FIGS. 3(a) and (b), line l is on the above-mentioned horizontal plane connecting A and B. The contacting points of line l with the bend shape cross sections of < are A and B. The angle $\alpha$ may be measured also by drawing a straight line contacting both protrusions constituting the inside portion of the curvature in the bend shape cross section of < or in an enlarged shape corresponding to said cross section, to determine contacting points A and B, and obtaining $\angle AOB$ in the same manner as mentioned above. Further, in a case where it is difficult to determine the above-mentioned contacting points, approximate points may be employed without leading to any serious error.

The preferred range of the angle $\alpha$ in the inorganic fibers in the second preferred embodiment of the present invention, i.e. in the silica glass fibers prepared by a sol-gel direct spinning method, is a range of $80° < \alpha < 170°$, more preferably a range of $90° < \alpha < 170°$.

When the ratio of acetone to water in the above-mentioned starting material increases, the cross-sectional shape of monofilaments gradually changes from the < shape of FIG. 2(b) to the < shape of FIG. 2(a). Namely, the cross-sectional shapes of FIGS. 2(a) and (b) depend on the ratio of acetone to water in the starting material composed of the same components.

If the curvature angle u is too small, the opening of the curved portion of the < shape becomes so narrow that when a resin is to be impregnated for the preparation of a laminated board, it becomes difficult for the resin to enter into and fill such an opening, whereby it becomes difficult to obtain an adequate effect to increase the adhesive strength between the resin and the monofilaments by enlarging the surface area of the monofilaments. Needless to say, there is no adhesion between the monofilaments and the resin at the surface portion of the monofilaments where no resin exists. For this reason, the lower limit for the angle $\alpha$ is 80° C. On the other hand, the angle $\alpha$ can not be so large due to the composition of the starting material, and the upper limit is 170°.

As compared with the weaving efficiency of a fabric from conventional inorganic fibers, there is no particular problem in weaving a fabric from inorganic fibers having a bend shape cross section of < and/or inorganic fibers having such a bend shape cross section with at least one recessed portion. Further, with respect to the fabric according to the second preferred embodiment of the present invention, the removal of the size by heat cleaning or the surface finishing with various finishing agents, can be conducted in the same manner as in the case of conventional fabrics. Furthermore, there is no substantial difference in the drill processability between the printed circuit substrate of the present invention and the conventional products made by silica glass fabric by a melting method.

The tensile strength of monofilaments of the inorganic fibers in the second preferred embodiment of the present invention is preferably at least about 15 kg/mm$^2$ in view of the operation efficiency in the spinning process and the subsequent processing and weaving processes, and in view of the quality of the products.

The woven fabric for a printed circuit substrate according to the second preferred embodiment of the present invention preferably has a thickness of from 0.025 to 0.40 mm, more preferably from 0.030 to 0.30 mm and a weight of from 15 to 450 g/m$^2$, more preferably from 15 to 300 g/m$^2$.

If the thickness is thinner than the above range or if the weight is lighter than the above range, the reinforcing effectiveness of the fabric tends t be small when made into a substrate, whereby it becomes difficult to attain the object. However, for a multilayer board, thin fabrics as mentioned above, are required. On the other hand, the fabric is not required to be so thick, since it is intended for use in a printed circuit substrate. Further, by providing fabrics having various thickness, it is possible to broaden the range for selection of the fabrics taking the reinforcing effects and operational efficiency into consideration, for instance, by using a greater number of thin fabrics instead of a small number of thick fabrics without changing the total weight of the fabrics in the substrate.

As an example of the non-woven fabric according to the second preferred embodiment of the present invention, a mat made of chopped strands and having a thickness of from 0.1 to 0.5 mm and a weight of from 15 to 150 g/m$^2$, may be mentioned.

The non-woven fabrics may be used alone or in combination with woven fabrics.

The fabric for a printed circuit board according to the second preferred embodiment of the present invention is a fabric for a printed circuit substrate composed mainly of inorganic fibers having a bend shape cross section of <, and/or inorganic fibers having such an angular cross section with at least one recessed portion, wherein the content of such inorganic fibers is within a range of from 40 to 100% by weight, preferably from 50 to 100% by weight.

The inorganic fibers constituting the fabric are usually twist yarns and/or plied yarns made of the abovementioned monofilaments, but may be in any other forms such as strands, slivers, rovings and multiple end yarns thereof (all these will be referred to generally as "yarns").

The inorganic fibers for the fabric for a printed circuit substrate according to the second preferred embodiment of the present invention, may contain monofilaments having cross sections other than the above-mentioned bend shape cross section.

Inorganic fiber yarns constituting a fabric may contain, in addition to the monofilaments having the above-mentioned cross-sectional shape, monofilaments having cross sectional shapes other than the above-mentioned cross sectional shape. Otherwise, either the warp or the weft of the fabric is made of fibers of monofilaments having a cross-sectional shape other than the above-mentioned cross section, e.g. silica glass fibers made by a melting method.

The above-mentioned fabric for a printed circuit substrate, is firstly subjected to the removal of the size by a suitable method such as heat cleaning, and then subjected to surface finishing with a chromium-type finishing agent or silane-type finishing agent to strengthen the adhesion to the resin, whereby a surface-finished fabric is obtained. The printed circuit substrate of the present invention is prepared by laminating such finished fabrics for a printed circuit substrate by using a resin as a binder. As mentioned above, it is common to laminate the fabrics in the form of prepreg.

As the resin, there may be mentioned, for instance, unsaturated polyester resins, epoxy resins, phenol resins, polyimide resins and PTFE.

A printed circuit substrate to which the present invention relates, is a so-called composite material composed of inorganic fibers and a resin, wherein the inorganic fibers serve as a reinforcing material for the resin. When the inorganic fibers are glass fibers, the surface of glass fibers are finished with a chromium-type finishing agent or a silane-type finishing agent, as mentioned above, to strengthen the adhesion between the glass fibers and the resin. For the improvement of the dimensional stability of a printed circuit substrate as defined in JIS C6486-1980, it may be mentioned that the thermal expansion coefficient of the resin should be small, the dimensional restoration of the resin to the original dimension after being subjected to heating should be good, the thermal expansion coefficient of the glass fibers (which is usually smaller than that of the resin) should be small, and the resin and the glass fibers should be firmly bonded. In an attempt to reduce the thermal expansion coefficient of glass fibers, it is conceivable and practically adopted to use silica glass fibers instead of ordinary E glass fibers.

The first preferred embodiment of the present invention is based on the concept that the adhesive strength with the resin is increased by using inorganic fibers composed mainly of those having a non-circular cross-sectional shape such as an elliptic, oblong or oval shape, as opposed to a circular cross-sectional shape, and/or those having such a non-circular cross-sectional shape with at least one recessed portion.

Likewise, the second preferred embodiment of the present invention is based on the concept that the adhesive strength of the fabrics with the resin is increased by using inorganic fibers composed mainly of those having a bend shape cross section of < and/or monofilaments having such a bend shape cross-section with at least one recessed portion.

The adhesive strength of the inorganic fibers as a reinforcing material for a printed circuit substrate, with the resin, is proportional to the surface area of the inorganic fibers in contact with the resin if other conditions are the same. With respect to the cross sections of inorganic fiber monofilaments in the direction perpendicular to the longitudinal direction of the monofilaments, the ratio of the surface areas of various fibers having the same composition and physical properties, may be considered to be equivalent to the ratio of the circumferential lengths of the cross sections of the fiber monofilaments, and the fibers having the same weight may be considered to be fibers having the same cross-sectional surface areas. In short, for the comparison of the surface areas of various fibers having the same weight when the inorganic fiber contents in the printed circuit substrates are constant, the circumferential lengths of the respective cross sections may be compared if the surface areas of the cross sections are equal.

The first preferred embodiment of the present invention presents a fabric made of inorganic fibers having a non-circular cross-sectional shape such as an elliptic, oblong or oval shape, as opposed to a circular cross section, and/or inorganic fibers having such a non-circular cross-sectional shape with at least one recessed portion, which have a greater surface area, under the same weight, than the ordinary inorganic fibers having a circular cross section, on the basis that a circle has the minimum circumferential length so long as the area of a shape in a plane is constant. At the same time, it presents a printed circuit substrate comprising such fabrics as the reinforcing material.

Likewise, the second preferred embodiment of the present invention presents a fabric made of inorganic fibers having a bend shape cross section of <, as opposed to a circular cross section, and/or inorganic fibers having such a bend shape cross section with at least one recessed portion, which have a greater surface area, under the same weight, than the ordinary inorganic fibers having a circular cross section, since a circle has the minimum circumferential length so long as the cross-sectional area of monofilaments is constant. At the same time, it presents a printed circuit substrate comprising such fabrics as the reinforcing material.

Now, the present invention will be described in further detail with reference to Examples. However, it should be understood that the present invention is by no means restricted by these specific Examples.

EXAMPLE 1

As the base material, a plain weave fabric of silica glass fibers (average aspect ratio of a/b=2) obtained by a sol-gel direct spinning method according to the first preferred embodiment of the present invention, a plain weave fabric of silica glass fibers (average angle $\alpha=105°$) obtained by a sol-gel direct spinning method according to the second preferred embodiment of the present invention, a plain weave fabric of ordinary E glass fibers and a plain weave fabric of silica glass fibers obtained by a melting method, as shown in Table 1, were used. Each fabric was subjected to heat cleaning, and then to surface treatment with epoxy silane, and impregnated with a heat resistant epoxy resin to obtain a prepreg. Eight layers of such prepreg were laminated and molded to obtain a laminated board. The dimensional stability (dimensional change) of a test piece (280×280 mm) of the laminated board, was measured in accordance with JIS C6486. The dimensional stability according to this JIS is represented by a dimensional change of the test piece of the laminated board as between before and after the treatment at 170° C. for 30 minutes. The results of the measurement are shown in Table 2.

TABLE 1

Glass woven fabrics and prepregs

| Base material | Weight (g/m²) | Density (filaments/25 mm) Longitudinal | Density (filaments/25 mm) Transverse | Diameter of monofilament (μm) | Resin content in prepreg (%) |
|---|---|---|---|---|---|
| E glass woven fabric | 110 | 40 | 40 | Average 10 | 52 |
| Silica glass woven fabric by a melting method | 100 | 40 | 40 | Average 10 | 52 |
| Silica glass woven fabric by a sol-gel direct spinning method (first preferred embodiment) | 100 | 40 | 40 | Average Major axis 14 Minor axis 7 (a/b = 2) | 52 |
| Silica glass woven fabric by a sol-gel direct spinning method (second preferred embodiment) | 100 | 40 | 40 | Average $\alpha = 105°$ | 52 |

TABLE 2

Dimensional stabilities of laminated boards

| Base material | Thickness distribution (mm) | Dimensional change (shrinkage) (%) Longitudinal | Dimensional change (shrinkage) (%) Transverse |
|---|---|---|---|
| E glass woven fabric | 1.6 ± 0.12 | 0.014 | 0.020 |
| Silica glass woven fabric by a melting method | 1.6 ± 0.06 | 0.008 | 0.010 |
| Silica glass woven fabric by a sol-gel direct spinning method (first preferred embodiment) | 1.6 ± 0.04 | 0.005 | 0.006 |
| Silica glass woven fabric by a sol-gel direct spinning method (second preferred embodiment) | 1.6 ± 0.05 | 0.006 | 0.006 |

The dimensional stability of the laminated board made of the woven fabric of silica glass fibers obtained by a sol-gel direct spinning method according to the present invention is superior to that of the laminated board made of the fabric of E glass fibers and the laminated board made of the fabric of silica glass fibers obtained by a melting method, as Comparative Examples.

EXAMPLE 2

As the non-woven fabrics, mats prepared by chopping strands of silica glass fibers obtained by a sol-gel direct spinning method and subjected to silane treatment, into a length of 13 mm, uniformly dispersing and piling the chopped strands and binding the piled strands with an epoxy resin, were used.

The mat of the fibers according to the first preferred embodiment of the present invention (average major axis 14 μm, average minor axis 7 μm, a/b=2) was designated as A (weight 100 g/m²), the mat of the fibers according to the second preferred embodiment of the present invention (average angle $\alpha=105°$) was designated as B (weight 100 g/m²) and the mats prepared from strands of silica glass fibers obtained by a melting method and strands of E glass fibers in the same manner as above, were designated as C (weight 100 g/m²) and D (weight 110 g/m²), respectively.

The E glass woven fabric and the silica glass fabric by a melting method were the same as those identified in Table 1.

As test samples, four types of laminated boards were prepared. The construction of the base materials for the respective laminated boards are shown below:
(1) E glass woven fabric+D (7 plies)+E glass woven fabric,
(2) Silica glass woven fabric by a melting method+C (7 plies)+silica glass woven fabric by a melting method,
(3) Silica glass woven fabric by the present invention's first preferred embodiment+A (7 plies)+silica glass woven fabric by the present invention's first preferred embodiment,
(average major axis 14 μm, minor axis 7 μm, a/b=2)
(4) Silica glass woven fabric by the present invention's second preferred embodiment +B (7 plies)+silica glass woven fabric by the present invention's second preferred embodiment, (average angle α=105°)

The resin content in each of the laminated boards prepared by binding these base materials with an epoxy resin was about 52%.

The dimensional stabilities of the laminated boards were measured in the same manner as in Example 1, and the results are shown in Table 3.

TABLE 3

| | Dimensional stabilities of laminated boards | | |
|---|---|---|---|
| Base material | Thickness distribution (mm) | Dimensional change (shrinkage) (%) | |
| | | Longitudinal | Transverse |
| (1) | 1.6 ± 0.10 | 0.032 | 0.040 |
| (2) | 1.6 ± 0.06 | 0.012 | 0.022 |
| (3) | 1.6 ± 0.04 | 0.009 | 0.017 |
| (4) | 1.6 ± 0.04 | 0.007 | 0.015 |

The dimensional stability of the laminated board made of both the non-woven fabric and the woven fabric of silica glass fibers obtained by the present invention is superior to that of the laminated board (1) made of both the woven fabric and the non-woven fabric of E glass fibers and to that of the laminated board (2) made of both the woven fabric and the non-woven fabric of silica glass by a melting method, as Comparative Examples.

The total surface area of monofilaments is greater in the fabric according to the first preferred embodiment of the present invention than in the conventional fabrics having the same weight (g/m$^2$) and monofilament diameter. For instance, the circumferential length of a monofilament having a cross-sectional shape as shown in FIG. 1(2), is about 1.02 times the circumferential length of a monofilament having a circular cross section with the same cross-sectional area, when the aspect ratio of a/b=1.5, about 1.08 times when a/b=2, about 1.2 times when a/b=3, about 1.33 times when a/b=4, and about 1.44 times when a/b=5. Accordingly, the total surface area of the monofilaments becomes greater by more than 1 times corresponding to the above values of a/b.

Likewise, the total surface area of monofilaments is greater in the fabric according to the second preferred embodiment of the present invention than in the conventional fabrics having the same weight (g/m$^2$) and monofilament diameter. For instance, the cross-sectional shape of the monofilament shown in FIG. 2(a) has an angle α=110°, and its circumferential length is about 1.4 times the circumferential length of a monofilament having a circular cross section with the same cross-sectional area. Accordingly, the total surface area of the monofilaments is greater by about 1.4 times. Likewise, the cross-sectional shape of the monofilament shown in FIG. 2(b), has an angle α=118°, and its circumferential length is about 1.35 times the circumferential length of a monofilament having a circular cross section with the same cross-sectional area. Accordingly, the total surface area of the monofilaments is greater by about 1.35 times.

In a printed circuit substrate made of a composite material comprising the fabric of the present invention and a resin such as an unsaturated polyester resin, an epoxy resin or a phenol resin, the adhesion of the resin to the fabric is stronger as a whole than the adhesion in a case where the conventional fabrics are employed, by virtue of the above-mentioned properties of the fabric of the present invention. When the temperature of the surrounding environment of the printed circuit substrate is raised, the fabric serves to prevent the free expansion of the resin which has a greater thermal expansion coefficient. The fabric of the present invention provides stronger adhesion with the resin than the conventional fabrics, and the above-mentioned ability to prevent the expansion of the resin is likewise greater.

The ability to prevent the free expansion of the resin can also be obtained by selecting a material having a minimum thermal expansion coefficient as the material for the fabric. In fact, a fabric made of silica glass fibers having a small thermal expansion coefficient may be used instead of E glass fibers which are commonly employed. Also in the case where a fabric made of silica glass fibers is used, an improved ability to prevent the free expansion of the resin is obtainable by the fabric made of monofilaments having a non-circular cross section according to the present invention, as compared with monofilaments having a circular cross section.

Since the ability of the fabric of the present invention to prevent the free expansion of the resin is greater than that of the conventional fabrics, the printed circuit substrate made of the composite material comprising the fabric of the present invention as a constituting component, has dimensional stability superior to the conventional fabrics.

The woven fabric according to the first preferred embodiment of the present invention is made of monofilaments having a non-circular cross section and/or monofilaments having such a non-circular cross section with at least one recessed portion, and accordingly, the monofilaments as well as yarns in the woven fabric hardly undergo shifting. Thus, it has an advantage that the drawbacks of a woven fabric such as the dislocation of the yarns or a fray of fibers hardly takes place.

The same advantage is obtainable by the woven fabric according to the second preferred embodiment of the present invention wherein the constituent yarns are made of inorganic fibers having a bend shape cross section of < and/or inorganic fibers having such a bend shape cross section with at least one recessed portion.

Further, silica glass has a smaller dielectric constant than E glass. Therefore, the fabric of the present invention made of such silica glass fibers and the printed circuit substrate comprising such a fabric and a resin, are superior to those made of E glass fibers in their electric characteristics.

We claim:
1. A printed circuit substrate comprising a fabric composed essentially of silica glass fibers, each said fiber having a cross section of an elliptic, oblong or oval shape with an aspect ratio (major axis/minor axis) of from 1.5 to 7.5, or of such an elliptic, oblong or oval shape with at least one recessed portion, said silica glass fibers having been prepared by a sol-gel direct spinning method.

2. A printed circuit substrate comprising a fabric composed essentially of silica glass fibers, each said fiber having a cross section of a bend shape of <, or of such a bend shape with at least one recessed portion, said silica glass fibers having been prepared by a sol-gel direct spinning method.

3. The printed circuit substrate according to claim 1 or 2, wherein the fabric is a woven fabric.

4. The printed circuit substrate according to claim 1 or 2, wherein the fabric is a non-woven fabric.

* * * * *